United States Patent
Ward et al.

(10) Patent No.: US 6,824,321 B2
(45) Date of Patent: Nov. 30, 2004

(54) KEYPAD ASSEMBLY

(75) Inventors: Isaac Ward, Queenscliff (AU); Kenneth Weselake, San Diego, CA (US)

(73) Assignee: Siemens Communications, Inc., Boca Raton, FL (US)

(*) Notice: Subject to any disclaimer, the term of this patent is extended or adjusted under 35 U.S.C. 154(b) by 0 days.

(21) Appl. No.: 10/247,234

(22) Filed: Sep. 19, 2002

(65) Prior Publication Data

US 2004/0057769 A1 Mar. 25, 2004

(51) Int. Cl.⁷ .............................................. H04M 1/00
(52) U.S. Cl. ..................... 400/479; 400/480; 400/490; 200/5 A; 200/512; 361/680; 345/168; 379/368
(58) Field of Search ................ 379/368; 345/168; 361/680; 200/5 A, 512; 400/472, 495, 480, 490, 479

(56) References Cited

U.S. PATENT DOCUMENTS

| | | | | |
|---|---|---|---|---|
| 4,500,758 A | * | 2/1985 | Guckenheimer | 200/5 A |
| 4,818,829 A | * | 4/1989 | Nopper et al. | 200/514 |
| 5,374,449 A | * | 12/1994 | Buhlmann et al. | 427/100 |
| 5,666,112 A | * | 9/1997 | Crowley et al. | 341/22 |
| 5,669,486 A | * | 9/1997 | Shima | 200/314 |
| 5,797,482 A | * | 8/1998 | LaPointe et al. | 200/314 |
| 5,815,139 A | * | 9/1998 | Yoshikawa et al. | 345/157 |
| 5,871,088 A | * | 2/1999 | Tanabe | 200/514 |
| 6,035,180 A | * | 3/2000 | Kubes et al. | 455/575.1 |
| 6,061,446 A | * | 5/2000 | Lester et al. | 379/428.01 |
| 6,148,075 A | * | 11/2000 | Inubushi et al. | 379/368 |
| 6,369,801 B2 | * | 4/2002 | Boireau et al. | 345/169 |
| 6,373,008 B1 | * | 4/2002 | Saito et al. | 200/310 |
| 6,402,579 B1 | * | 6/2002 | Pichler et al. | 445/24 |
| 6,512,827 B1 | * | 1/2003 | Kitamura | 379/433.01 |
| 6,750,414 B2 | * | 6/2004 | Sullivan | 200/512 |

* cited by examiner

*Primary Examiner*—Andrew H. Hirshfeld
*Assistant Examiner*—Dave A. Ghatt

(57) ABSTRACT

A keypad assembly utilizes touch-detecting apparatus such as force sensors or touchpad assemblies for registering key presses. In exemplary embodiments, the keypad assembly is suitable for use in electronic devices such as a mobile telephones, calculators, hand-held computers, or the like, having single piece molded housings wherein the keypad assembly is at least partially encapsulated within the housing.

16 Claims, 7 Drawing Sheets

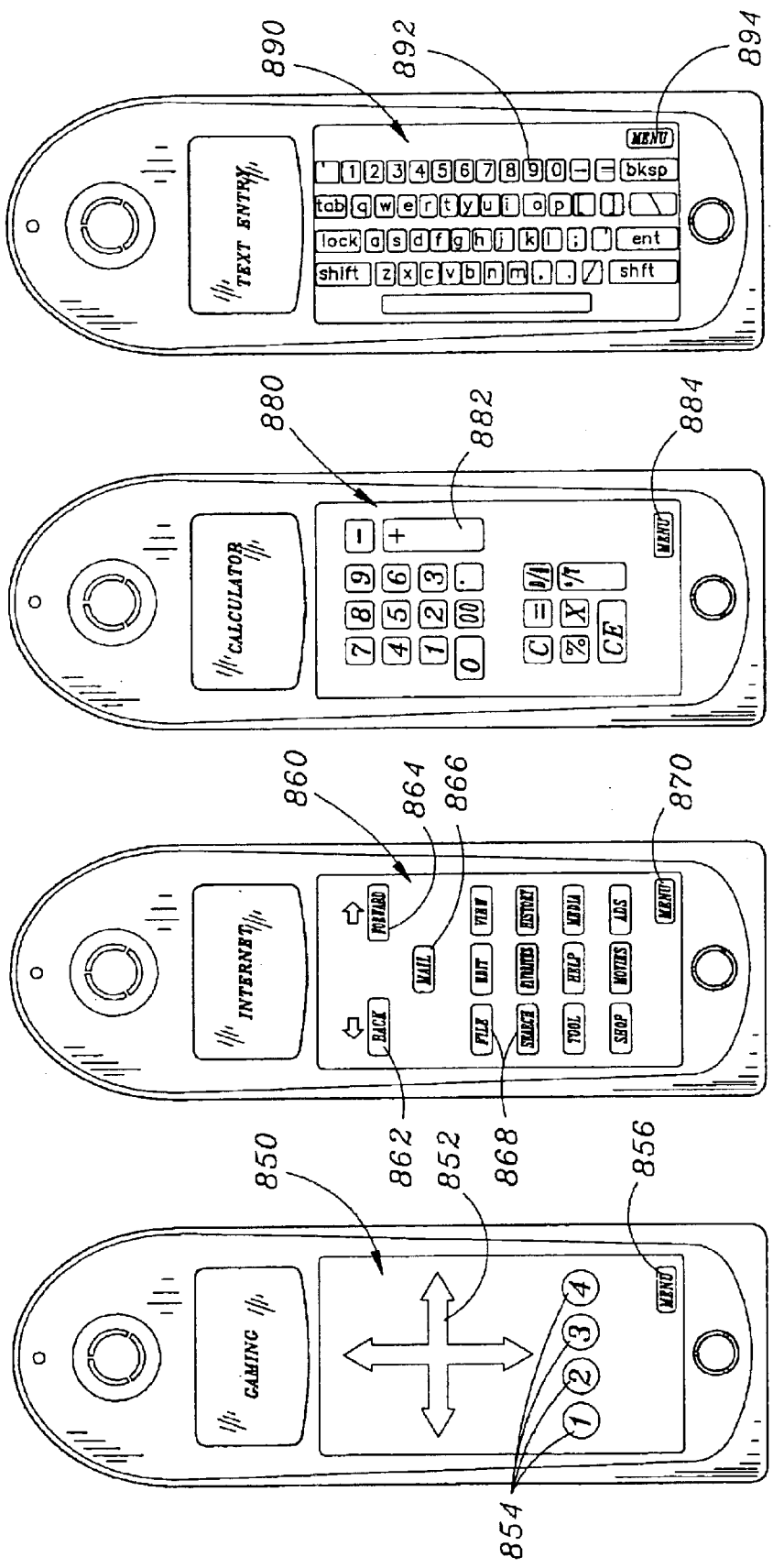

KEYPAD ASSEMBLY

BACKGROUND OF THE INVENTION

The present invention relates generally to keypad assemblies used in electronic devices such as mobile telephones, cordless telephone handsets, hand held computers, or the like, and more particularly to keypad assemblies employing touch detecting apparatus capable of sensing forces applied to keys of the keypad assembly for registering key presses.

Hand held electronic devices such as mobile telephones, cordless telephone handsets, hand-held computers, calculators, and the like, often employ keypads for entry of information and commands. FIG. 1 illustrates a traditional keypad assembly used in such devices. The keypad assembly 100 includes a circuit board 102 having a plurality of conductors 104. A keypad 106 is disposed over the circuit board 102. The keypad 106 includes a plurality of keys 108 consisting of resilient key domes 110, each providing a contact 112, positioned over a corresponding conductor 104 of the circuit board 102. When a force (F) is applied to a key 108 of the keypad 106, its key dome 110 is collapsed, bringing the contact 112 of the key dome 110 into contact with the corresponding conductor 104 disposed on the circuit board 102. This contact changes the electrical conductance of the conductor 104, registering a key press.

Traditional keypad assemblies employ a fixed key layout that is used for all input functions. Consequently, any new or different key assignments must be mapped to the existing key structure. This remapping of key assignments can cause confusion for the user of the electronic device employing the keypad assembly, and is limited by the original layout of the keys of the keypad assembly. Additional flexibility may be obtained by utilizing part of the display of the electronic device to provide key assignment choices to selected keys. This technique is used by the electronic device 200 illustrated in FIG. 2. The electronic device 200, in this case a mobile telephone, includes a housing 202 having a keypad assembly 204 and display 206. The keypad assembly 204 includes one or more dynamic function keys, 208 and 210, which are positioned directly below the display 206. The display 206, in turn, includes areas or regions 212 and 214 positioned adjacent to the function keys 208 and 210, that are used for displaying functions of the electronic device 200. In this manner, the function keys 208 and 210 may be used for selecting among various functions displayed in the regions 212 and 214. However, in most applications, the number of keys available for use as function keys is constrained by the space allotted on the display, since use of the display for displaying functions limits the display area that may be used for other purposes. Consequently, functions typically must be presented in a menu format, which many users find confusing.

In many applications, it would be desirable to provide an electronic device such as a mobile telephone, cordless telephone handset, or the like, having a single piece molded housing or shell, wherein the keyboard assembly is encapsulated within the material providing the housing. For example, electronic devices having this structure may often be manufactured at a substantially lower cost than devices having a conventional multi-piece housing and require less tooling and design time to produce. However, encapsulation of a traditional keypad assembly has proven problematic. As shown in FIG. 3, when a traditional keypad assembly 300 is encapsulated in a molded housing, resin is injected into the mold under pressure. As a result, one or more key domes 302 of the keypad assembly 300 may become collapsed. Due to the pressures exerted within the mold during molding of the housing 304, the subsequent depression 306 formed within the key dome 302 when it collapses becomes filled with resin, which sets and hardens, permanently holding the key dome 302 in the collapsed position. As a result, the keypad assembly 300 registers a continuous key press making the keypad assembly 300, and the electronic device containing the keypad assembly 300, unusable. Moreover, because the keypad assembly 300 is permanently encapsulated within the housing material of the electronic device, the electronic device typically cannot be repaired and must be discarded, resulting in unacceptable manufacturing waste when encapsulation methods are used.

Consequently, it is desirable to provide a keypad assembly for an electronic device such as a mobile telephone, a cordless telephone handset, a calculator, a hand-held computer, or the like, which utilizes touch detecting apparatus such as force sensors or touchpad assemblies instead of traditional key domes. The keypad assembly should be capable of encapsulation within the housing of the electronic device.

SUMMARY OF THE INVENTION

The present invention is directed to a keypad assembly that utilizes touch detecting apparatus such as force sensors or touchpad assemblies for registering key presses. The keypad assembly is suitable for use in electronic devices such as mobile telephones, cordless telephone handsets, calculators, hand-held computers, or the like. In exemplary embodiments, these electronic devices may have single-piece-molded housings wherein the keypad assembly is at least partially encapsulated within the housing. The present invention is also directed to methods for manufacturing encapsulated keypad assemblies and electronic devices employing an encapsulated keypad assembly.

According to a specific embodiment, the present invention provides a keypad assembly employing force sensors for registering key presses. The keypad assembly includes a substrate having one or more force sensors disposed thereon and an encapsulation layer molded onto the substrate over the force sensors. Each force sensor is suitable for sensing a force applied to a portion of the encapsulation layer over to the force sensor for registering a key press. Preferably, force registration by the force sensors is adjustable for canceling preload forces placed on the force sensor due to molding of the housing.

According to another specific embodiment, the present invention provides a keypad assembly employing a touch pad for registering key presses. The keypad assembly includes a plurality of electroluminescent (EL) sheets generally disposed or layered one over the other, each being capable of displaying a keypad when illuminated. A touchpad or touch screen is disposed over the electroluminescent sheets. Preferably, the touchpad is substantially transparent allowing the keypad of the illuminated electroluminescent sheet to be viewed by a user of the keypad assembly. The touchpad is suitable for detecting a touch or force applied over a key of the displayed keypad for registering a press of the key. The keypad assembly may be at least partially encapsulated, and may be employed by an electronic device such as a mobile telephone, cordless telephone handset, or the like.

According to another specific embodiment, the present invention provides a method for manufacturing an encapsulated keypad assembly. The method includes the steps of assembling a keypad utilizing a touch sensing assembly in accordance with the present invention, and overmolding an encapsulation layer onto the keypad so that the keypad is at least partially encapsulated within the encapsulation layer. The encapsulation layer may comprise a portion of the housing of the electronic device in which the keypad assembly is assembled. In one embodiment, the touch sensing assembly comprises a force sensor mounted to a substrate. In this embodiment, the method may further include the step of adjusting force registration by the force sensor for canceling preload forces placed on the force sensor by molding of the encapsulation layer. In another embodiment, the keypad assembly includes at least two electroluminescent (EL) sheets generally disposed or layered one over the other, each being capable of displaying a keypad when illuminated. A touchpad or touchscreen is disposed over the electroluminescent sheets for detecting a touch or force applied over a key of the displayed keypad to register a press of the key.

It is to be understood that both the foregoing general description and the following detailed description are exemplary and explanatory only and are not necessarily restrictive of the invention claimed. The accompanying drawings, which are incorporated in and constitute a part of the specification, illustrate embodiments of the invention and together with the general description, serve to explain the principles of the invention.

BRIEF DESCRIPTION OF THE DRAWINGS

FIGS. 8A, 8B, 8C, 8D, 8E, 8F and 8G are top plan views of the mobile telephone shown in FIG. 7, illustrating exemplary keypads capable of being displayed by electroluminescent sheets of the keypad assembly.

DETAILED DESCRIPTION OF SPECIFIC EMBODIMENTS

Reference will now be made in detail to the presently preferred embodiments of the invention, examples of which are illustrated in the accompanying drawings.

Figure 4:
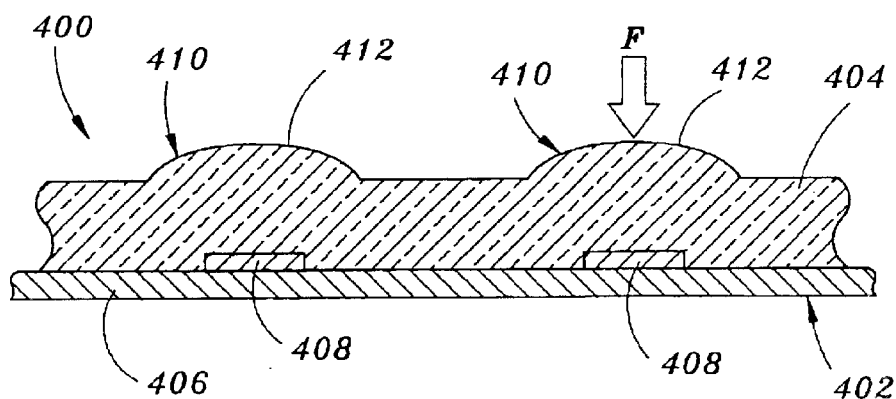
FIG. 4 is a cross-sectional side elevation view illustrating an exemplary keypad assembly in accordance with the present invention.

FIG. 4 illustrates an encapsulated keypad assembly 400 in accordance with an exemplary embodiment of the present invention. The keypad assembly 400 is comprised of a keypad 402 and an encapsulation layer 404 molded to, and at least partially encapsulating, the keypad 402. As shown in FIG. 4, the keypad 402 includes a substrate 406 having one or more force sensors 408 disposed thereon. In exemplary embodiments, the substrate 406 is comprised of a printed circuit board (PCB) providing circuitry for interconnecting the force sensors 408 with the processing system of the electronic device. However, it is contemplated that the substrate 406 may alternately comprise any surface suitable for supporting the force sensors 408. Thus, for example, the substrate 406 may comprise a sub-layer of a housing of an electronic device employing the keypad assembly 400, a plastic or metal insert, or the like, without departing from the scope and spirit of the present invention. It is contemplated that the force sensors 408 may employ any suitable force sensing technology. For example, in one embodiment, the force sensors 408 may comprise piezoelectric force cells. Such piezoelectric force cells employ silicone implanted piezoresistors that flex under an applied force causing the resistance of the piezoresistors to increase. This change in resistance results in a change or delta in the voltage or current output that registers a key press. However, the force sensors 408 may employ other force sensing technologies without departing from the scope and spirit of the present invention.

The encapsulation layer 404 is overmolded onto the surface of the keypad 402 using a suitable molding process so that the force sensors 408 are encapsulated between the substrate 406 and the encapsulation layer 404. Alternately, the keypad 402 (i.e., substrate 406 and force sensors 408) may be completely encapsulated within the encapsulation layer 404. The encapsulation layer 404 may be molded from a suitable plastic material, which may be either a thermoplastic or a thermoset material. Exemplary materials suitable for use in fabricating the encapsulation layer 404 include plastics such as polycarbonate plastics, methyl methacrylate ester polymers, and the like. In specific embodiments of the invention, the encapsulation layer 404 may be formed of a material that is substantially translucent or transparent, allowing the substrate 406 to be provided with indicia, painted or decorated with graphics, logos, and the like, that are viewable through the encapsulation layer 404.

In embodiments of the invention, the keypad assembly 400 may include multiple keys 410 arranged in a conventional configuration (e.g., a telephone keypad configuration, a calculator keypad configuration, a QWERTY keyboard configuration, a Dvorak keyboard configuration, or the like). Alternately, the keypad assembly 400 may include one or more keys arranged in an application specific configuration. In accordance with the present invention, each key 410 of the keypad assembly 400 is comprised of the portion of the encapsulation layer 404 to which a force may be applied that is detectable by a corresponding force sensor 408 mounted to the substrate 406. When a sufficient force is applied to a key 410 of the keyboard assembly 400, the force is detected by one or more of the force sensors 408 and registered as a key press. In exemplary embodiments, the encapsulation layer 404, or, alternately, at least the portions of the encapsulation layer 404 forming one or more keys 410, may be molded of a generally resilient material allowing forces thereon to be readily transmitted to the force sensors 408. However, those of skill in the art will appreciate that more rigid materials may be used depending upon the force sensor technology employed and specific application requirements.

As shown in FIG. 4, separate force sensors 408 are provided for each key 410 of the keypad assembly 400. In this manner, the application of a force of a sufficient magnitude to a specific key 410 is detected by a corresponding force sensor 408, whereupon a key press is registered. Each key 410 of the keypad assembly 400 may include a shape 412 such as a bump, indent, alphanumeric character, or the like, molded into the encapsulation layer 404 over a respective force sensor 408. This shape 412 provides texture to the key 410 allowing a user of the keypad assembly 400 to tactilely identify the position of the key 410.

Indicia such as graphics, alphanumeric characters, or the like may also be applied to the encapsulation layer 404 to identify the position and/or function of keys 410 of the keypad assembly 400. Depending on the manufacturing process used, indicia may be printed or painted on the encapsulation layer 404 after molding, applied as decals, or applied using techniques such as in-mold decoration (IMD), applique molding, or the like. In one embodiment, indicia may be applied to the encapsulation layer 404 subsequent to molding to identify keys 410 of the keypad assembly 400. The positions of the identified keys 410 may then be stored (e.g., in firmware memory of the keypad assembly 400, in memory of an electronic device in which the keypad assembly 400 is used, or the like). In this manner, the specific configuration or arrangement of keys 410 of the keypad assembly 400 may be selected after fabrication of the keypad assembly 400 using suitable firmware or software. Moreover, because software is used to control the location of keys 410 of the keypad assembly 400, it becomes possible to modify the function of the keypad assembly 400 after encapsulation by supplying the keypad assembly 400 with new software.

Force registration by the force sensors 408 is adjustable for canceling preload forces placed on the force sensors 408 by molding of the encapsulation layer 404. In exemplary embodiments, the force sensors 408 comprise analog-based semiconductor devices (e.g., piezoelectric force cells, or the like) which produce an electrical current in the presence of an applied force. Such devices typically indicate change in the force sensed by a corresponding change in voltage or current produced. Thus, it is possible to cancel out any forces exerted in the force sensor 408 during molding of the encapsulation layer 404. Moreover, any change in forces exerted on the force sensors 408 by the encapsulation layer, for example, due to material relaxation, or the like, can be accommodated. Detection and canceling of forces exerted on the force sensors 408 may be accomplished using a suitable force canceling circuit, firmware, and/or software.

Figure 5:
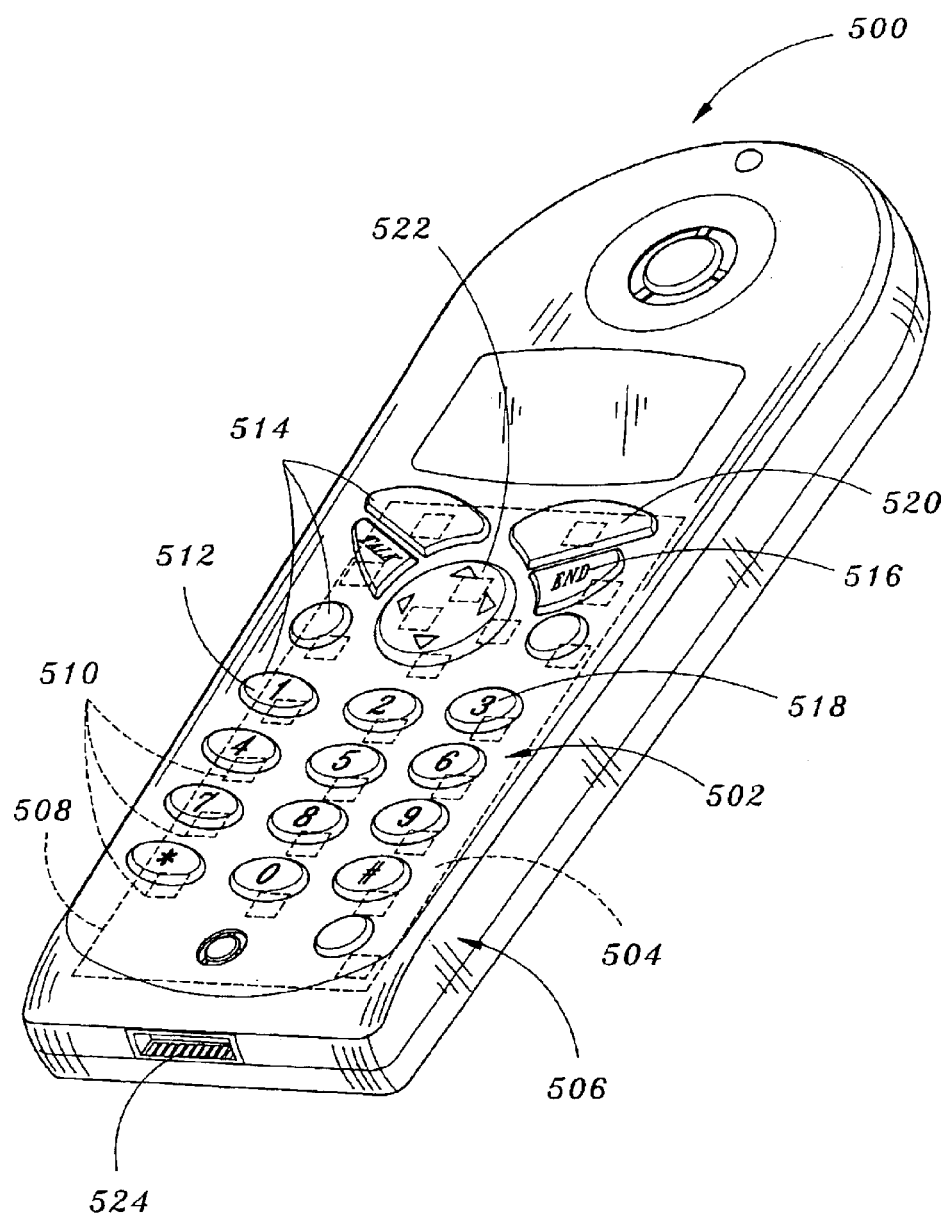
FIG. 5 is a perspective view illustrating a mobile telephone having an encapsulated keypad assembly in accordance with the present invention.

In embodiments of the invention, the keypad assembly 400 may be fabricated as a distinct component or part suitable for assembly in electronic devices including, but not limited to, mobile telephones, cordless telephone handsets, calculators, hand-held computers, or the like. However, keypad assemblies in accordance with the present invention may alternately be fabricated as an integral portion of the housing of such electronic devices wherein the housing itself forms the encapsulation layer of the keyboard assembly. FIG. 5 illustrates an exemplary electronic device, in this case a mobile telephone 500, having a keypad assembly 502 fabricated in this manner.

As shown in FIG. 5, the mobile telephone 500 includes a keypad assembly 502 comprising a keypad 504 that is at least partially encapsulated within the housing 506 of the telephone 500. The keypad 504 includes a substrate 508 having a plurality of force sensors 510 arranged thereon in the pattern of the keys 512 of the keypad assembly 502. In the embodiment shown, the substrate 508 is comprised of a printed circuit board (PCB) providing circuitry for interconnecting the force sensors 510 with the processing system of the mobile telephone 500. Alternately, the substrate 508 may comprise a sub-layer of the housing 506, a plastic or metal insert, or the like.

In the embodiment illustrated in FIG. 5, the housing 506 comprises a single piece molding that is overmolded onto the keypad 504 (i.e., the substrate 508 and force sensors 510) so that the keypad 504 is encapsulated within the housing 506. The housing 506 may be molded from a suitable plastic material, which may be either a thermoplastic or a thermoset material, using conventional mono-shot or multi-shot molding processes. Exemplary materials suitable for use in fabricating the housing 506 include plastics such as polycarbonate plastics, methyl methacrylate ester polymers, and the like. Electronics and/or firmware/software within the molded housing 506 are accessible for testing or force canceling via a coupling port 524 (which in some embodiments also may be used to accept an external cable or cradle for power and additional communications to an external device such as a computer).

Keys 512 of the keypad assembly 502 may comprise shapes or bumps 514 molded into the surface of the housing 506 over respective force sensors 510. These shapes 514 provide texture to the keys 512, tactilely identifying the position of the keys 512 to a user of the mobile telephone 500. Indicia 516 including graphics (e.g., arrows), alphanumeric characters (e.g., the numbers "0" through "9" and characters "*" and "#"), and words (e.g., "TALK" and "END") may further be applied to the housing 506 over the key shapes 514 for identifying the various functions of the keys 512 to users of the mobile telephone 500.

It is contemplated that keypad assemblies in accordance with the present invention may implement any key type commonly provided by conventional "domed" keypad assemblies through selective placement of force sensors. For example, in the embodiment shown in FIG. 5, the keypad assembly 502 includes numeric keys 518, function keys 520 and a scroll key 522. The numeric keys 518 and function keys 520 each comprise a shape 514 molded into the housing 506 so as to be positioned over a corresponding force sensor 510. The scroll key 522 is formed as a single round key shape 514 having multiple force sensors 510. As shown in FIG. 5, the scroll key 522 includes indicia comprised of arrows located near the top, bottom, left and right edges of the key 522. Force sensors 510 are positioned under each arrow so that a sufficient force applied by a user to the scroll key 522 at any arrow is registered by the force sensor 510 disposed beneath that arrow as a key press of scroll key 522 for scrolling through information displayed in the direction indicated by the arrow.

As described in the discussion of FIG. 4, force registration by force sensors 510 of the keypad assembly 502 is adjustable for canceling preload forces placed on the force sensors 510 by molding of the housing 506. The force sensors 510 are preferably analog-based semiconductor devices (e.g., piezoelectric force cells, or the like), which produce an electrical current in the presence of an applied force, and which indicate change in the force sensed by a corresponding change in voltage or current produced. Thus, it is possible to cancel any forces exerted due to encapsulating the keypad 504 during molding of the housing 506. Moreover, any change in forces exerted on the force sensors 510 by the housing 506, for example, due to material relaxation, or the like, are accommodated. In exemplary embodiments, detection and canceling of forces exerted on the force sensors 510 may be accomplished using a suitable force canceling circuit, firmware, and/or software executed by the processing system of the mobile telephone 500.

Figure 6:
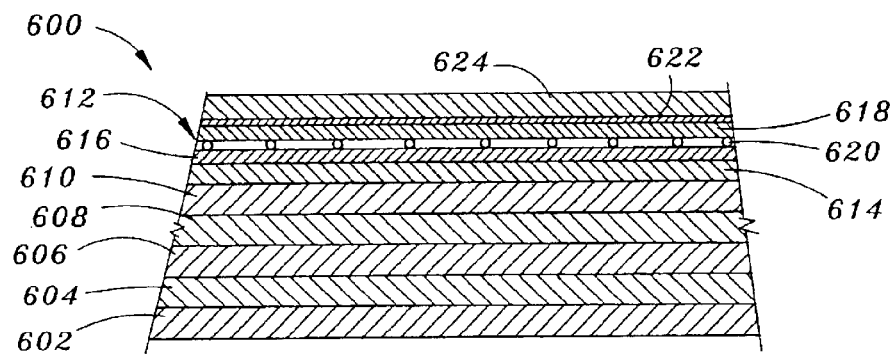
FIG. 6 is a side elevation view illustrating an exemplary keypad assembly in accordance with a second embodiment of the present invention, wherein the keypad assembly employs a touchpad or touchscreen disposed over layered electroluminescent sheets each capable of displaying a specific keypad.

FIG. 6 illustrates a keypad assembly 600 in accordance with a second exemplary embodiment of the present invention. The keypad assembly 600 includes a plurality of electroluminescent (EL) panels or sheets 602–610 each providing a distinct keypad when illuminated. These electroluminescent sheets 602–610 are layered or stacked so that the electroluminescent sheets 602–610 are generally disposed one over the other. A touchpad 612 is disposed over the electroluminescent sheets 602–610 for receiving touch input by a user of the keypad assembly 600. The touchpad 612 detects a force applied over a key of the displayed keypad for registering a press of the key. Preferably, the touchpad 612 is substantially transparent for allowing the keypad displayed by the illuminated electroluminescent sheet 602–610 to be viewed by a user of the electronic device in which the keypad assembly 600 is assembled.

When illuminated, each of the electroluminescent sheets 602–610 display a keypad having a predefined configuration of keys. Preferably, this predefined configuration of keys is formed in the electroluminescent sheet during its fabrication. Preferably, when not illuminated, the electroluminescent sheets 602–610 are substantially transparent so that an illuminated sheet disposed at a lower layer can be viewed by a user of the keypad assembly 600. In this manner, the electroluminescent sheets 602–610 may be individually illuminated to display a variety of keypads. These keypads may include keys having a variety of different colors and two-dimensional shapes and sizes, allowing the keypad assembly 600 to provide multiple cosmetically appealing keypad configurations.

To display a particular keypad, the electroluminescent sheet containing that keypad, for example, electroluminescent sheet 602, is illuminated, while other electroluminescent sheets within the keypad assembly 600, for example, sheets 604–610, are not illuminated. Suitable software is provided to control which keypad is displayed to the user by controlling which of the electroluminescent sheets 602–610 is illuminated at a given time and maps areas of the touchpad to the keys of the displayed keypad so that a force detected within an area over a specific key caused by a user touching that area is registered as a press of the key. In this manner, the keypad assembly 600 may be made dynamically changeable for providing customized, situational dependent keypads, which are displayed according to the user input required.

The touchpad 612 may employ any suitable touch-sensing or digitizer technology. For example, in the embodiment illustrated in FIG. 6, the keypad assembly 600 includes a touchpad 612 employing resistive touchscreen technology. In this embodiment, the touchpad 612 includes a substantially transparent glass or plastic panel 614 that is covered with conductive and resistive metallic layers 616 and 618, held apart by spacers 620. A scratch-resistant layer 622 may be provided for covering and protecting conductive and resistive layers 616 and 618. During operation, an electrical current is passed through the conductive and resistive layers 616 and 618 creating an electrical field. When a user touches the touchpad assembly, the two layers 616 and 618 contact one another in the area touched. The change in the electrical field is noted and the coordinates of the point of contact may be calculated. Alternately, touchpad 612 may employ other touch-sensing technologies including capacitive touchscreen technologies, or the like, without departing from the scope and spirit of the present invention.

A protective coating 624 may be applied over the touchpad 612 for protecting the surface of the touchpad 612 from damage and/or wear due to use. The protective coating 624 may also prevent the intrusion of environmental contaminants such as water, dust, or the like into the keypad assembly 600. In exemplary embodiments, the protective coating 624 may comprise an encapsulation layer overmolded onto the touchpad 612. For example, in one embodiment, the keypad assembly 600 may be at least partially encapsulated within the housing of the electronic device in which the keypad assembly 600 is assembled.

The construction of electroluminescent sheets 602–610 employed by keypad assembly 600 is less complex than conventional liquid crystal displays (LCD) or electroluminescent (EL) displays which are capable of displaying dynamic images (i.e., images that may be changed). Consequently, the electroluminescent sheets 602–610 are generally lighter, more robust, and cost less to produce than such displays. Moreover, because each of electroluminescent sheets 602–610 displays a single permanently embedded image when illuminated, the sheets 602–610 do not require sophisticated display drivers. Further, because the electroluminescent sheets 602–610 are more robust than conventional liquid crystal or electroluminescent displays, the keypad assembly 600 of the present invention is less susceptible to damage due to mishandling than are conventional touchscreen display assemblies. The keypad assembly 600 is also less costly to produce, and depending on the number of electroluminescent sheets 602–610 used, may be lighter and thinner than such touchscreen display assemblies.

Figure 7:
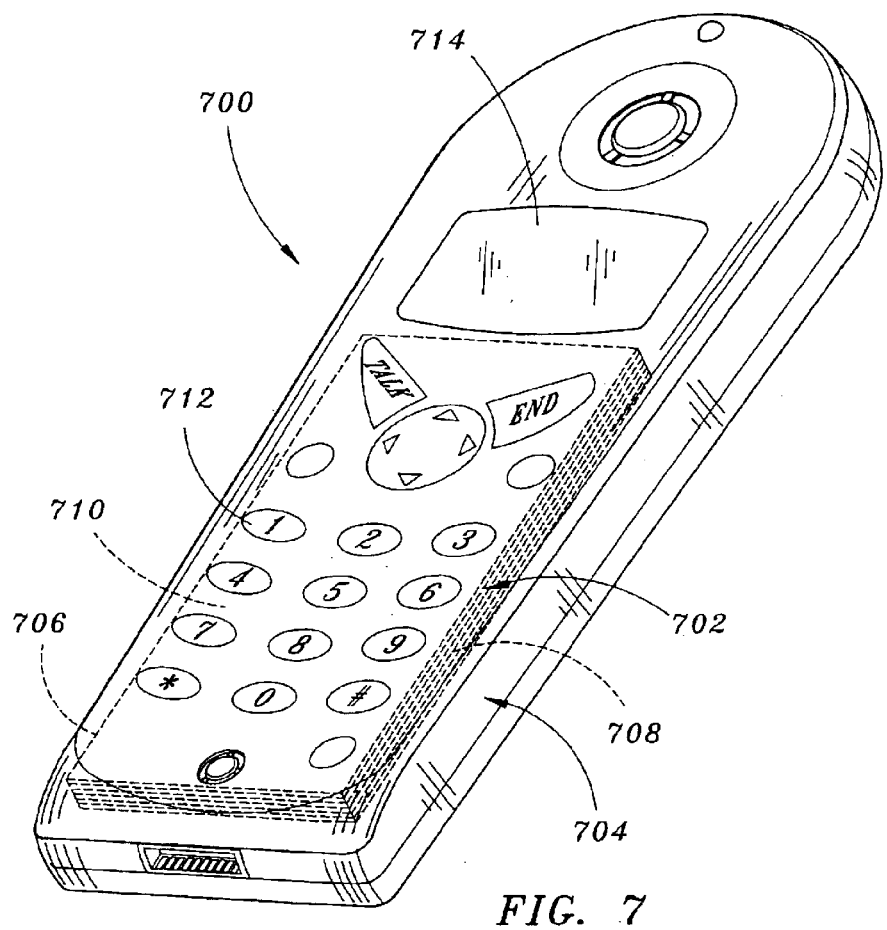
FIG. 7 is a perspective view illustrating a mobile telephone having a keypad assembly comprised of a touchpad disposed over layered electroluminescent sheets in accordance with the present invention.

In embodiments of the invention, the keypad assembly 600 may be fabricated as a distinct component or part suitable for assembly in electronic devices including, but not limited to, mobile telephones, cordless telephone handsets, calculators, hand-held computers, or the like. The keypad assembly 600 may alternately be fabricated as an integral portion of the housing of such electronic devices wherein the housing itself forms the protective coating 624 of the keypad assembly 600. FIG. 7 illustrates an exemplary electronic device, in this case a mobile telephone 700, having a keypad assembly fabricated in this manner.

As shown in FIG. 7, the mobile telephone 700 includes a keypad assembly 702 that is at least partially encapsulated within the housing 704 of the mobile telephone 700. The keypad assembly 702 includes a substantially transparent touchpad 706 disposed over a plurality of electroluminescent sheets 708 layered or stacked one over the other. Each of the electroluminescent sheets 708 displays a keypad 710 having a predefined configuration of keys 712 when illuminated and is substantially transparent when not illuminated. The touchpad 706 detects a touch or force applied over a key 712 of the displayed keypad 710 for registering a key press. Software controls which of the keypads 710 is displayed to the user by controlling which of the electroluminescent sheets 708 is illuminated. Software also maps areas of the touchpad 706 to the keys 712 of the displayed keypad 710 so that a force detected within an area over a specific key 712 caused by a user touching that area is registered as a press of the key 712.

Figure 2:
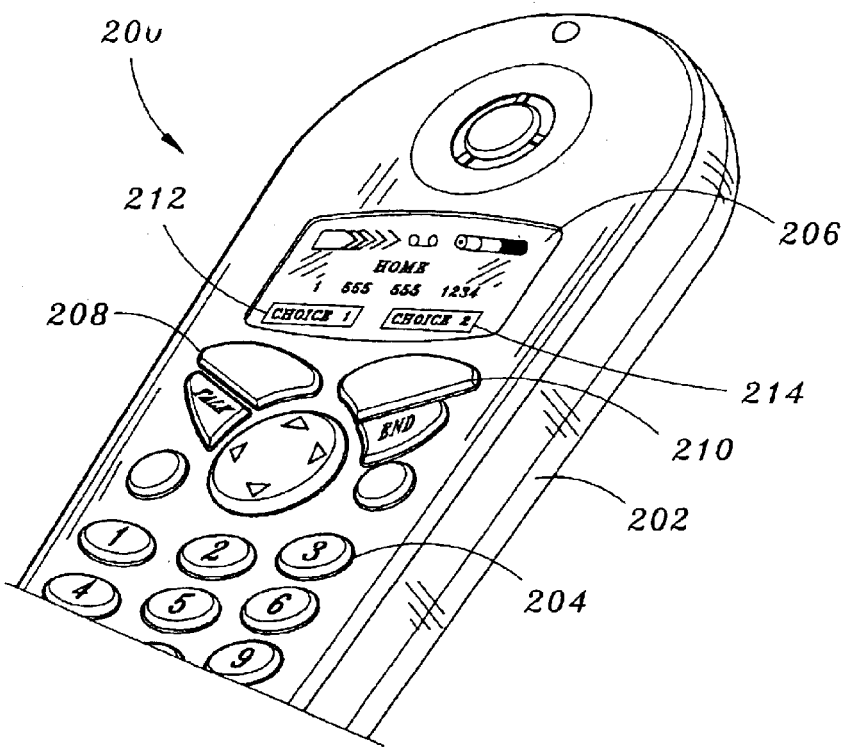
FIG. 2 is a partial perspective view illustrating a mobile telephone having a keypad assembly and display employing function keys in accordance with the prior art.
Figure 3:
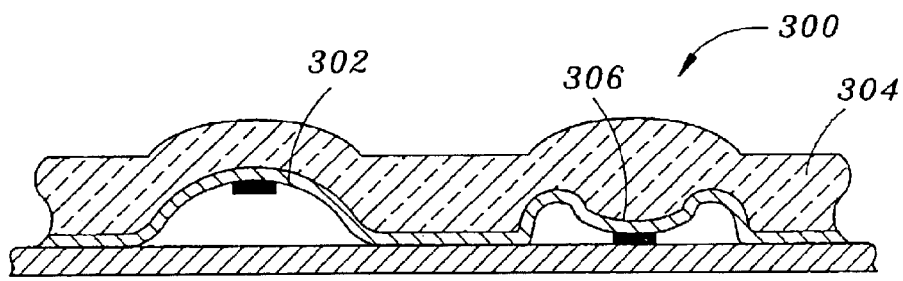
FIG. 3 is a cross-sectional side elevation view illustrating a traditional keypad assembly encapsulated within the housing of a hand held electronic device.

A display 714 is positioned adjacent to the keypad assembly 702 for communicating information to the user. Because the keypad assembly 702 is dynamically configurable, the display 714 need not be used for displaying functions selected using dynamic function keys (see FIG. 2). Thus, the entire display 714, or, alternatively, a larger portion of the display 714, may be employed for communicating other kinds of information such as telephone directory data, caller identification information, information obtained from the Internet, or the like.

In one embodiment, the housing 704 may comprise a single piece molding that is overmolded onto the keypad assembly 702 providing an encapsulation layer that serves as a protective layer for the keypad assembly 702. The housing 704 may be molded from a suitable plastic material, which may be either a thermoplastic or a thermoset material, using conventional mono-shot or multi-shot molding processes. Exemplary materials suitable for use in fabricating the housing 704 include plastics such as polycarbonate plastics, methyl methacrylate ester polymers, and the like. The housing 704 can be formed to accommodate a coupling port 716, similar to coupling port 524 discussed above.

In FIG. 7, a keypad 710 is displayed having keys arranged in a conventional telephone keypad configuration. Thus, the keypad 710 includes numeric keys and function keys suitable for accessing control menus, telephone number directories, and the like. However, it is contemplated that the keypad assembly 702 may provide multiple keypads having keys arranged in configurations suited for use in accessing and controlling the particular applications and functions provided by the mobile telephone 700. Moreover, like the keypad assembly 600 illustrated in FIG. 6, the keypad assembly 702 of the mobile telephone 700 shown in FIG. 7 is dynamically changeable and is capable of providing customized, situational dependent keypads 710 to the user depending on the user input required. FIGS. 8A through 8G illustrate other exemplary keypads 800, 810, 830, 850, 860, 880 and 890 that maybe displayed by illuminating individual electroluminescent (EL) sheets 708 of the keypad assembly 702 of the mobile telephone 700.

Figure 8C:
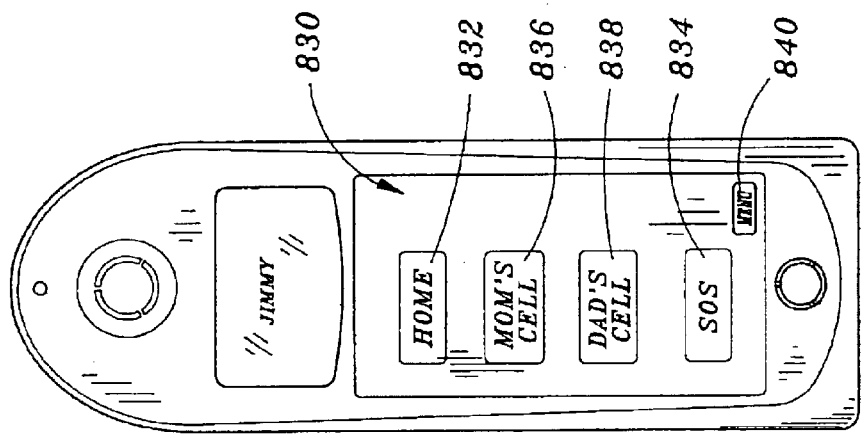
Figure 8B:
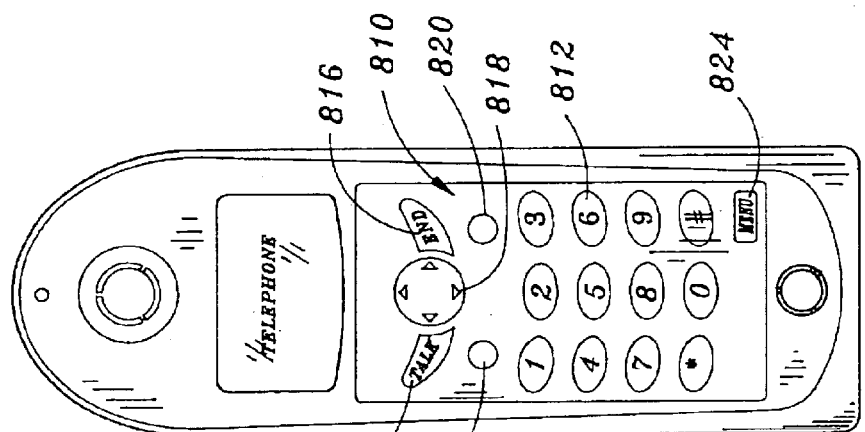
Figure 8A:
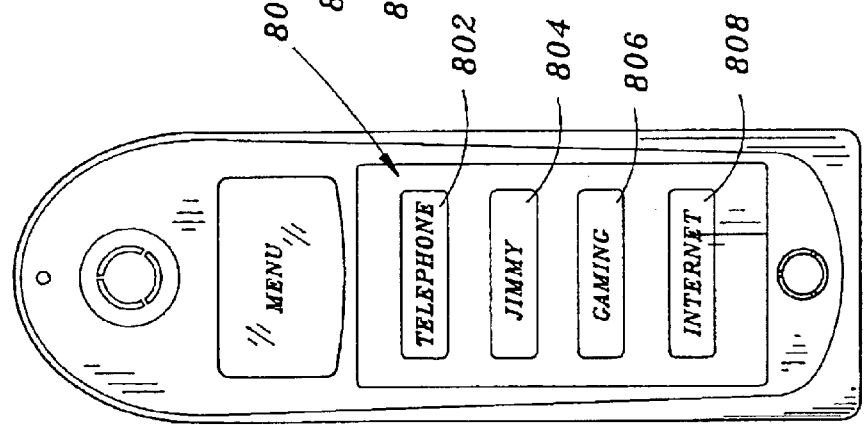

FIG. 8A depicts a keypad 800 providing a menu configuration for selecting among the applications or functions supported by the mobile telephone 700. In the embodiment shown, the keypad 800 includes keys allowing a user to select menu items for initiating a telephone application ("TELEPHONE" 802), a child's telephone application ("JIMMY" 804), a gaming application ("GAMING" 806), and an Internet browser application ("INTERNET" 808). Preferably, selection of a particular menu item key 802–808 causes the keypad assembly 702 (FIG. 7) to illuminate the electroluminescent sheet 708 (FIG. 7) providing a keypad 710 (FIG. 7) associated with the selected menu item.

FIG. 8B illustrates an exemplary keypad 810 having keys arranged in a conventional telephone keypad configuration. In exemplary embodiments of the invention, the telephone keypad 810 is accessed by selecting the menu item key "TELEPHONE" 802 from the menu keypad 800 (FIG. 8A). The telephone keypad 810 includes numeric keys 812, a key for initiating or answering a call ("TALK" 814), and a key for ending a call ("END" 816). In the embodiment illustrated, the keypad 810 further includes a toggle key 818 suitable for accessing control menus and telephone number directories, and the like, displayed by the display 714 (FIG. 7), a key for accessing voice mail 820 and a key for turning a speakerphone loudspeaker on or off 822. A menu key ("MENU" 824) is provided for displaying the menu keypad 800 (FIG. 8A).

FIG. 8C illustrates an exemplary keypad 830 having keys arranged in a simplified telephone keypad configuration suitable for use by a child. The child's telephone keypad 830 includes keys which when selected initiate calls to a limited number of desired telephone extensions. For example, keys may be provided which initiate calls to the child's home ("HOME" 832), persons (e.g., emergency response personnel, police, etc.) to be called if the child is in danger ("SOS" 834) and the cellular telephones of the child's mother and father ("MOM'S CELL" 836 and "DAD'S CELL" 838). In exemplary embodiments of the invention, the child's keypad 830 is accessed by selecting the menu item key "JIMMY" 804 from the menu keypad 800 (FIG. 8A). A menu key ("MENU" 840) is provided for displaying the menu keypad 800 (FIG. 8A).

FIG. 8D illustrates an exemplary keypad 850 having keys arranged in a configuration suitable for use with a gaming application provided by the mobile telephone 700 (FIG. 7). In the exemplary embodiment shown, the gaming keypad 850 includes a character movement control key 852 having up/down/left/right movement arrows suitable for controlling movement of a gaming character displayed by the display 714 (FIG. 7) of the mobile telephone 700 (FIG. 7). Control keys 854 control functions of the gaming application. In exemplary embodiments of the invention, the gaming keypad 850 is accessed by selecting the menu item key "GAMING" 806 from the menu keypad 800 (FIG. 8A). A return key ("MENU" 856) is provided for displaying the menu keypad 800 (FIG. 8A).

FIG. 8E illustrates an exemplary keypad 860 having keys arranged in a configuration suitable for use by an Internet browser application. Scroll keys ("BACK" 862 and "FORWARD" 864) provide scrolling or jumping between Internet information displayed by the display 714 (FIG. 7) of the mobile telephone 700 (FIG. 7). One or more keys ("MAIL" 866) may be provided for accessing electronic mail (e.g., email), text messages, or the like. Additional keys 868 may be provided, as necessary, to implement common browser functions. In exemplary embodiments of the invention, the Internet browser keypad 830 is accessed by selecting the menu item key "INTERNET" 808 from the menu keypad 800 (FIG. 8A). A return key ("MENU" 870) is provided for displaying the menu keypad 800 (FIG. 8A).

FIG. 8F illustrates an exemplary calculator keypad 880 that may be provided by the mobile telephone 700 (FIG. 7). The calculator keypad 880 includes keys 882 arranged in a conventional business calculator configuration. Alternately, keys 882 of the calculator keypad 880 may be arranged in a scientific calculator configuration, a calculator configuration adapted for a specialized function (e.g., mortgage rate calculation, lease rate calculation, etc.) depending on the applications and functions provided by the mobile telephone 700 (FIG. 7). A return key ("MENU" 884) is provided for displaying the menu keypad 800 (FIG. 8A).

FIG. 8G illustrates an exemplary keypad 890 having keys 892 arranged in a configuration suitable for providing text entry. In the embodiment shown in FIG. 8G, the keys 892 of the keypad 890 are arranged in a QWERTY keyboard arrangement. However, it will be appreciated that the keys 892 may alternately be arranged in other desired keyboard configurations (e.g., alphabetic keyboard, Dvorak keyboard, etc.) depending on the requirements of the particular application requiring text entry. A return key ("MENU" 894) is provided for displaying the menu keypad 800 (FIG. 8A).

The keypads shown in FIGS. 8A through 8G are provided for purposes of illustration only, and are not inclusive of all possible keypads that may be provided by keypad assemblies in accordance with the present invention. Based on the foregoing discussion, it is contemplated that those of skill in the art may now design keypads having other key configurations for applications or function not specifically disclosed herein. It is believed that such keypads would not depart from the scope and spirit of the present invention. Moreover, while keypad assemblies 502 and 702 are illustrated as being implemented in a mobile telephone 500 and 700, those of skill in the art will recognize that keypad assemblies in accordance with the present invention may be utilized by virtually any electronic device.

Figure 9:
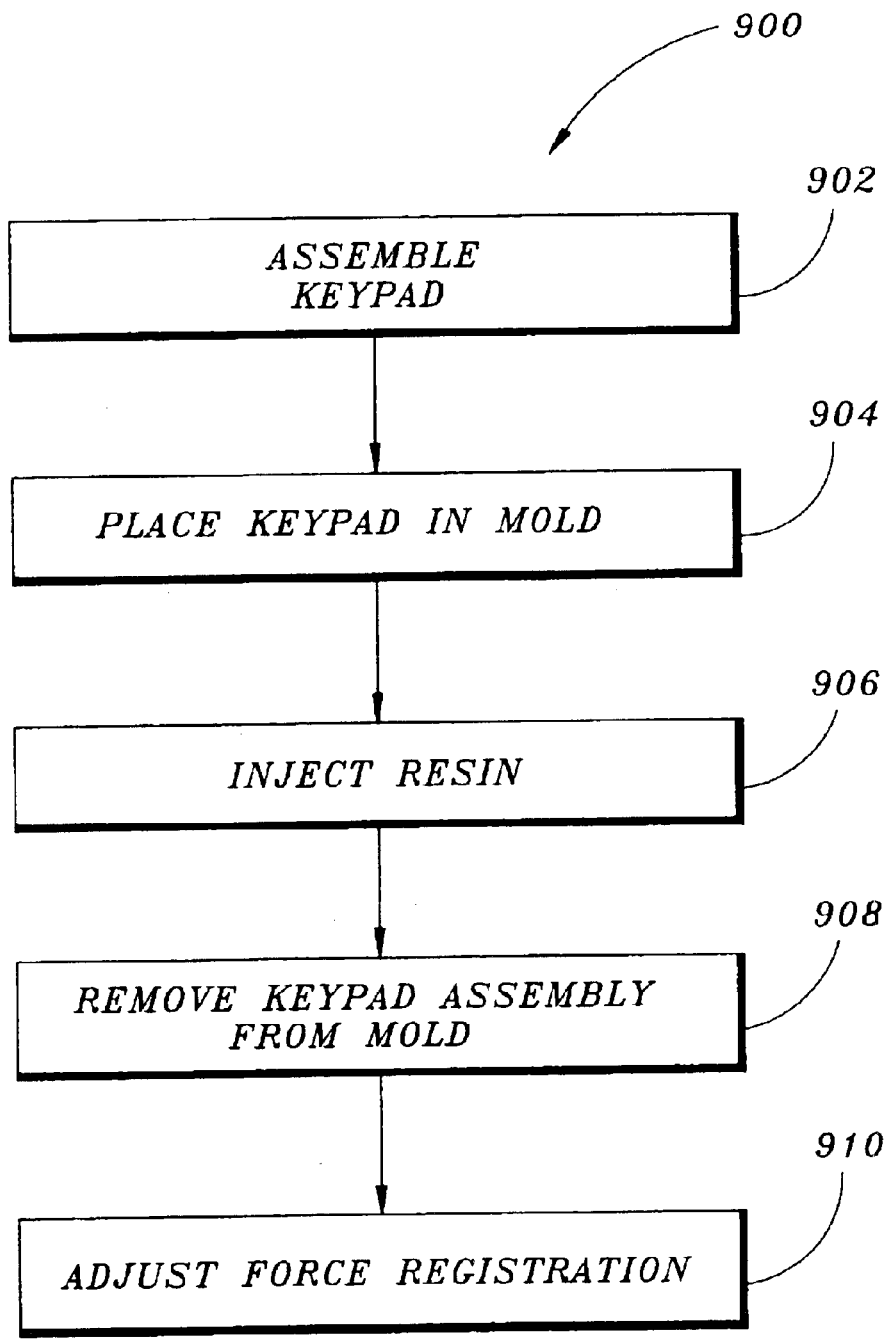
FIG. 9 is a flow diagram illustrating a method for manufacturing an encapsulated keypad assembly in accordance with the present invention.

Referring now to FIG. 9, a method for manufacturing an encapsulated keypad assembly in accordance with the present invention is described. In the exemplary embodiment shown, the method 900 is initiated at step 902 wherein a keypad in accordance with the present invention is assembled. In one embodiment, illustrated in FIGS. 4 and 5, the keypad may comprise a substrate having one or more force sensors disposed thereon. Alternately, the keypad may comprise a substantially transparent touchpad disposed over a plurality of electroluminescent sheets layered or stacked one over the other, as depicted in the embodiment shown in FIGS. 6 and 7. The assembled keypad is then placed in a mold, at step 904, for overmolding of an encapsulation layer onto the keypad. Resin is next injected into the mold, at step 906, and allowed to cure, whereupon the finished keypad assembly is removed from the mold, at step 908. As discussed in the description of FIGS. 5 and 7, the keypad assembly may be fabricated as an integral portion of the housing of such an electronic device such as a mobile telephone, cordless telephone handset, palmtop computer, or the like. Thus, in steps 904 through 908, the mold employed for encapsulation of the keypad may also facilitate molding of at least part of the housing of the electronic device employing the keypad assembly.

In embodiments employing encapsulated force sensors, force registration by the force sensors may then be adjusted, at step 910, for canceling preload forces placed on the force sensors by molding of the encapsulating layer. Moreover, any change in forces exerted on the force sensors by the encapsulation layer, for example, due to material relaxation, or the like, can be accommodated. In exemplary embodiments, detection and canceling of forces exerted on the force sensors may be accomplished using a suitable force canceling circuit, firmware, and/or software. Adjustment of force registration, at step 910, may be performed once following fabrication of the keypad assembly, or alternately, may be repeated as necessary to ensure proper cancellation of forces in the force sensors over the life of the keypad assembly (e.g., periodically, continuously, at start up of the electronic device in which the keypad is assembled, or the like).

Those of skill in the art will appreciate that various molding technologies may be adapted for molding of the encapsulation layer in steps 904 through 908. Such molding technologies include, but are not limited to, reaction injection molding (RIM), compression molding, foam urethane molding, reinforced foam molding, air casting, vacuum casting, dip casting, wax model casting, extrusion/blow molding, thermoforming, rotational casting, and lost core molding. Moreover, the encapsulation layer may be molded using either single-shot or multi-shot molding processes. Consequently, it is contemplated that the molding process used to mold the encapsulation layer may be modified by those of skill in the art to accommodate the specific molding technology employed. Such modification would not depart from the scope and spirit of the present invention as claimed in the appended claims.

Although the invention has been described with a certain degree of particularity, it should be recognized that the elements thereof may be altered by persons skilled in the art without departing from the scope and spirit of the invention.

It is understood that the specific order or hierarchy of steps in the method 900 illustrated in FIG. 9 is an example of an exemplary approach. Based upon design preferences, it is understood that the specific order or hierarchy of steps in the method 900 can be rearranged while remaining within the scope of the present invention. The accompanying method claims present elements of the various steps of the method 900 in a sample order, and are not meant to be limited to the specific order or hierarchy presented.

Figure 1:
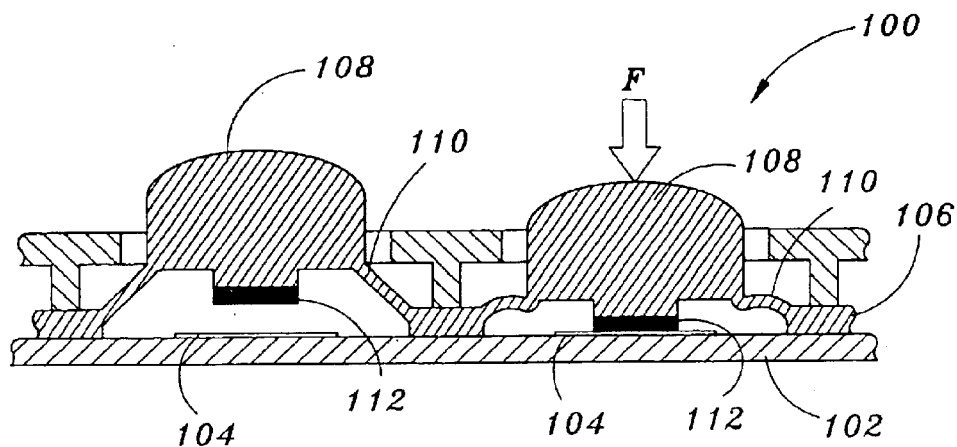
FIG. 1 is a cross-sectional side elevation view illustrating a traditional keypad assembly in accordance with the prior art.

The present invention provides an encapsulated keypad that allows overmolding of keypad components, while maintaining reliable key operation after encapsulation. Consequently, keypad assemblies manufactured in accordance with the present invention suffer a lower rejection rate during fabrication due to non-operational keys than do keypad assemblies fabricated utilizing conventional "domed" keypads, reducing manufacturing costs. Additionally, the present invention provides greater design flexibility since the present keypad assemblies do not utilize key domes, which must be carefully positioned when the keypad is designed in order to provide correct actuation. Nevertheless, it is contemplated that in exemplary embodiments, force sensors of the present invention may also be utilized in keypad assemblies employing traditional key domes instead of encapsulation. In such applications, force sensors would replace the conductors/contacts within keys of the keypad assembly (see FIG. 1). A force applied to a key of the keypad assembly would collapse the key dome, bringing the key dome into contact with the force sensor so that a force is applied to the force sensor. The force sensor would detect this force and register a key press.

It is believed that the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A keypad assembly, comprising:
   a plurality of electroluminescent sheets generally disposed one over the other, each of the plurality of electroluminescent sheets being capable of displaying a predetermined keypad when illuminated; and
   a touchpad disposed over the plurality of electroluminescent sheets for receiving a touch input, the touchpad being substantially transparent,
   wherein the touchpad is suitable for detecting a force applied thereto over a key of the keypad displayed by the electroluminescent sheet illuminated for registering a press of the key.

2. The keypad assembly as claimed in claim 1, further comprising an encapsulation layer disposed over the touchpad assembly.

3. The keypad assembly as claimed in claim 2, wherein the encapsulation layer is molded of a generally resilient material.

4. A keypad assembly, comprising:
   means for displaying a first keypad when illuminated;
   means for displaying a second keypad when illuminated, the means for displaying a first keypad and the means for displaying a second keypad being generally disposed one over the other;
   means, disposed over the means for displaying a first keypad and means for displaying a second keypad, for receiving a touch input, the means for receiving a touch input being substantially transparent, wherein the means for receiving a touch input is suitable for detecting a force applied thereto over a key of the first keypad when the means for displaying the first keypad is illuminated or a key of the second keypad when the means for displaying the second keypad is illuminated for registering a key press.

5. An electronic device, comprising:

a housing;

a keypad assembly disposed in the housing, the keypad assembly including:

a plurality of electroluminescent sheets generally disposed one over the other, each of the plurality of electroluminescent sheets being capable of displaying a predetermined keypad when illuminated; and a touchpad disposed over the plurality of electroluminescent sheets for receiving a touch input, the touchpad being substantially transparent, wherein the touchpad is suitable for detecting a force applied thereto over a key of the keypad displayed by the electroluminescent sheet illuminated for registering a press of the key.

6. The electronic device as claimed in claim 5, wherein the keypad assembly is at least partially encapsulated by the housing.

7. The electronic device as claimed in claim 6, wherein the housing is molded of a generally resilient material.

8. The electronic device as claimed in claim 5, further comprising a display assembly in the housing adjacent to the keypad assembly for displaying information to a user of the electronic device.

9. A mobile telephone, comprising:

a housing;

a keypad assembly disposed in the housing, the keypad assembly including:

a plurality of electroluminescent sheets generally disposed one over the other, each of the plurality of electroluminescent sheets being capable of displaying a predetermined keypad when illuminated; and a touchpad disposed over the plurality of electroluminescent sheets for receiving a touch input, the touchpad being substantially transparent, wherein the touchpad is suitable for detecting a force applied thereto over a key of the keypad displayed by the electroluminescent sheet illuminated for registering a press of the key.

10. The mobile telephone as claimed in claim 9, wherein the keypad assembly is at least partially encapsulated by the housing.

11. The mobile telephone as claimed in claim 10, wherein the housing is molded of a generally resilient material.

12. The mobile telephone as claimed in claim 9, further comprising a display assembly in the housing adjacent to the keypad assembly for displaying information to a user of the electronic device.

13. A keypad assembly, comprising:

a plurality of electroluminescent sheets generally disposed one over the other, each of the plurality of electroluminescent sheets including an embedded image of a keypad that is displayed when the electroluminescent sheet is illuminated; and a touchpad disposed over the plurality of electroluminescent sheets for receiving a touch input, wherein the touchpad detects a force applied thereto over a key of the embedded image of a keypad displayed by an illuminated electroluminescent sheet for registering a press of the key.

14. The keypad assembly as claimed in claim 13, further comprising an encapsulation layer disposed over the touchpad assembly.

15. The keypad assembly as claimed in claim 13, wherein the encapsulation layer is molded of a generally resilient material.

16. The keypad assembly as claimed in claim 13, wherein the embedded image of the keypad of at least one of the plurality of electroluminescent sheets comprises at least two of the colors red, green and blue.

* * * * *